(12) United States Patent
Kumagai

(10) Patent No.: US 10,590,534 B2
(45) Date of Patent: Mar. 17, 2020

(54) FILM DEPOSITION METHOD AND FILM DEPOSITION APPARATUS

(71) Applicant: Tokyo Electron Limited, Tokyo (JP)

(72) Inventor: Takeshi Kumagai, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 231 days.

(21) Appl. No.: 15/373,777

(22) Filed: Dec. 9, 2016

(65) Prior Publication Data

US 2017/0175266 A1 Jun. 22, 2017

(30) Foreign Application Priority Data

Dec. 17, 2015 (JP) .................................. 2015-246161

(51) Int. Cl.
| | |
|---|---|
| *C23C 16/02* | (2006.01) |
| *C23C 16/455* | (2006.01) |
| *C23C 16/40* | (2006.01) |
| *C23C 16/04* | (2006.01) |
| *H01J 37/32* | (2006.01) |
| *C23C 16/46* | (2006.01) |
| *C23C 16/50* | (2006.01) |

(52) U.S. Cl.
CPC ...... *C23C 16/45544* (2013.01); *C23C 16/045* (2013.01); *C23C 16/405* (2013.01); *C23C 16/45534* (2013.01); *C23C 16/45536* (2013.01); *C23C 16/45551* (2013.01); *C23C 16/46* (2013.01); *C23C 16/50* (2013.01); *H01J 37/3244* (2013.01); *H01J 37/32513* (2013.01); *H01J 37/32651* (2013.01); *H01J 37/32715* (2013.01); *H01J 37/32807* (2013.01)

(58) Field of Classification Search
CPC .................... C23C 16/45534; C23C 16/45548
See application file for complete search history.

(56) References Cited

U.S. PATENT DOCUMENTS

2007/0269982 A1 * 11/2007 Rocklein ............... C23C 16/405
438/680
2012/0052693 A1 * 3/2012 Ozaki ................... C23C 16/402
438/771

(Continued)

FOREIGN PATENT DOCUMENTS

| JP | 2012-209394 | 10/2012 |
|---|---|---|
| JP | 2013-135154 | 7/2013 |
| JP | 2015-213108 | 11/2015 |

*Primary Examiner* — David P Turocy
(74) *Attorney, Agent, or Firm* — IPUSA, PLLC

(57) ABSTRACT

A film deposition method is provided for filling a recessed pattern formed in a surface of a substrate with a film. In the method, a halogen-containing gas is supplied to a top surface of a substrate and an upper portion of a recessed pattern, thereby forming an adsorption blocking group on the top surface of the substrate and the upper portion of the recessed pattern. A first reaction gas is supplied to a surface of the substrate including the top surface and the recessed pattern to cause the first reaction gas to adsorb on an area where the adsorption blocking group is not formed on. A second reaction gas reactable with the first reaction gas is supplied to the surface of the substrate to produce a reaction product of the first reaction gas adsorbed on the bottom portion of the recessed pattern and the second reaction gas.

9 Claims, 12 Drawing Sheets

(56) References Cited

U.S. PATENT DOCUMENTS

| | | | |
|---|---|---|---|
| 2013/0171822 A1* | 7/2013 | Chandrashekar | ............................ H01L 21/28556 438/675 |
| 2015/0099373 A1* | 4/2015 | Sano | ................... C23C 16/4405 438/763 |
| 2015/0243545 A1* | 8/2015 | Tang | ................. H01L 21/76224 438/430 |
| 2015/0243883 A1* | 8/2015 | Swaminathan | ......... H01L 43/12 438/761 |
| 2016/0293398 A1* | 10/2016 | Danek | ................. H01L 21/0228 |
| 2017/0114459 A1* | 4/2017 | Saly | .................. H01L 21/02274 |

* cited by examiner

FILM DEPOSITION METHOD AND FILM DEPOSITION APPARATUS

CROSS-REFERENCE TO RELATED APPLICATION

The present application is based on Japanese Priority Application No. 2015-246161 filed on Dec. 17, 2015, the entire contents of which are hereby incorporated herein by reference.

BACKGROUND OF THE INVENTION

1. Field of the Invention

The present invention relates to a film deposition method and film deposition apparatus.

2. Description of the Related Art

Conventionally, as disclosed in Japanese Laid-Open Patent Application Publication No. 2013-135154, a film deposition method is known of causing a hydroxyl group to adsorb on an inner surface of a recessed portion formed in a substrate in a desired distribution, causing an organic aminosilane gas on the substrate on which the hydroxyl group is adsorbed, and supplying an oxidation gas to the substrate on which the organic aminosilane gas is adsorbed, thereby depositing a silicon oxide film in the recessed portion.

Such a film deposition method can deposit the film with a desired film thickness distribution by controlling an adsorption distribution of the hydroxyl group, thereby performing film deposition with high bottom-up properties or film deposition conforming to a shape of the recessed portion according to the intended purpose.

In the meantime, the above-mentioned film deposition with high bottom-up properties is being demanded for film deposition other than that of the silicon oxide film due to the increasing density and diversity of semiconductor integrated circuits.

SUMMARY OF THE INVENTION

The present invention is made in light of the above problems, and provides a film deposition method and film deposition apparatus that can be applied to film deposition other than film deposition of a silicon oxide film and can implement film deposition with high bottom-up properties by using a simple process and apparatus.

According to an embodiment, there is provided a film deposition method for filling a recessed pattern formed in a surface of a substrate with a film from a bottom surface of the recessed pattern. In the film deposition method, a halogen-containing gas is supplied to atop surface of a substrate and an upper portion of a recessed pattern formed in the top surface of the substrate, thereby forming an adsorption blocking group on the top surface of the substrate and the upper portion of the recessed pattern. A first reaction gas is supplied to a surface of the substrate including the top surface and the recessed pattern to cause the first reaction gas to adsorb on an area where the adsorption blocking group is not formed on, the area including a bottom portion of the recessed pattern other than the top surface of the substrate and the upper portion of the recessed pattern. A second reaction gas reactable with the first reaction gas is supplied to the surface of the substrate to produce a reaction product of the first reaction gas adsorbed on the bottom portion of the recessed pattern and the second reaction gas, thereby depositing a molecular layer of the reaction product on the bottom portion of the recessed pattern.

According to another embodiment, there is provided a film deposition apparatus that includes a process chamber, and a turntable provided in the process chamber and having a substrate receiving area on which a substrate is to be placed. A first reaction gas supply area is provided at a predetermined area along a rotational direction of the turntable and above the turntable, and configured to supply a first reaction gas to the turntable. A second reaction gas supply area is provided downstream of the first reaction gas supply area in the rotational direction of the turntable and above the turntable, and configured to supply a second reaction gas reactable with the first reaction gas and capable of producing a reaction product to the turntable. A halogen-containing gas supply area is provided downstream of the second reaction gas supply area in the rotational direction of the turntable and above the turntable, and configured to supply a halogen-containing gas to the turntable. A heater is provided below the turntable and configured to heat the turntable up to a predetermined temperature that does not cause the halogen-containing gas to exert an etching action.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF THE PREFERRED EMBODIMENTS

Embodiments of the present invention are described below with reference to accompanying drawings.

[Film Deposition Apparatus]

Figure 1:
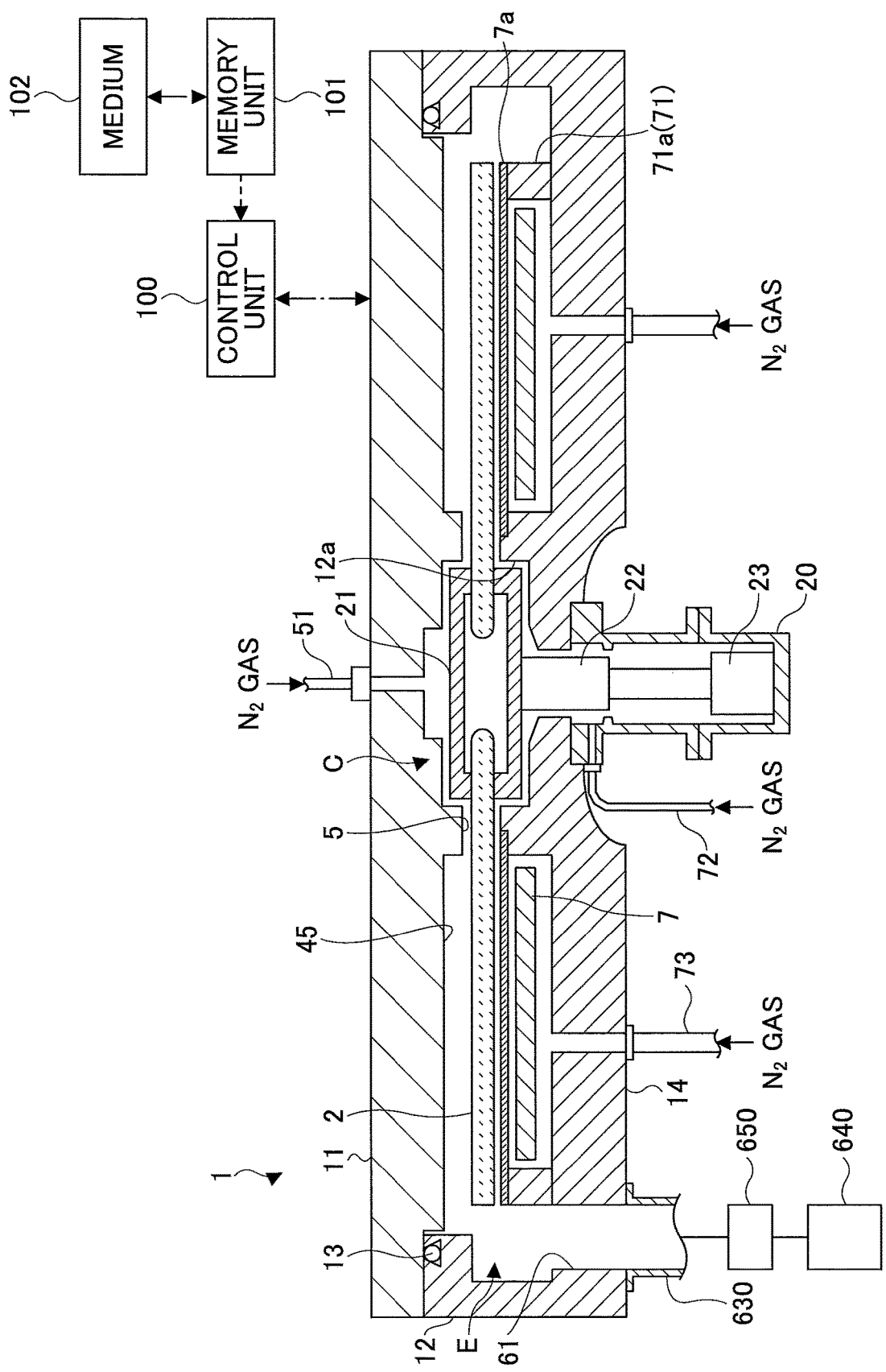
FIG. 1 a schematic cross-sectional view illustrating an example of a film deposition apparatus of an embodiment of the present invention.
Figure 2:
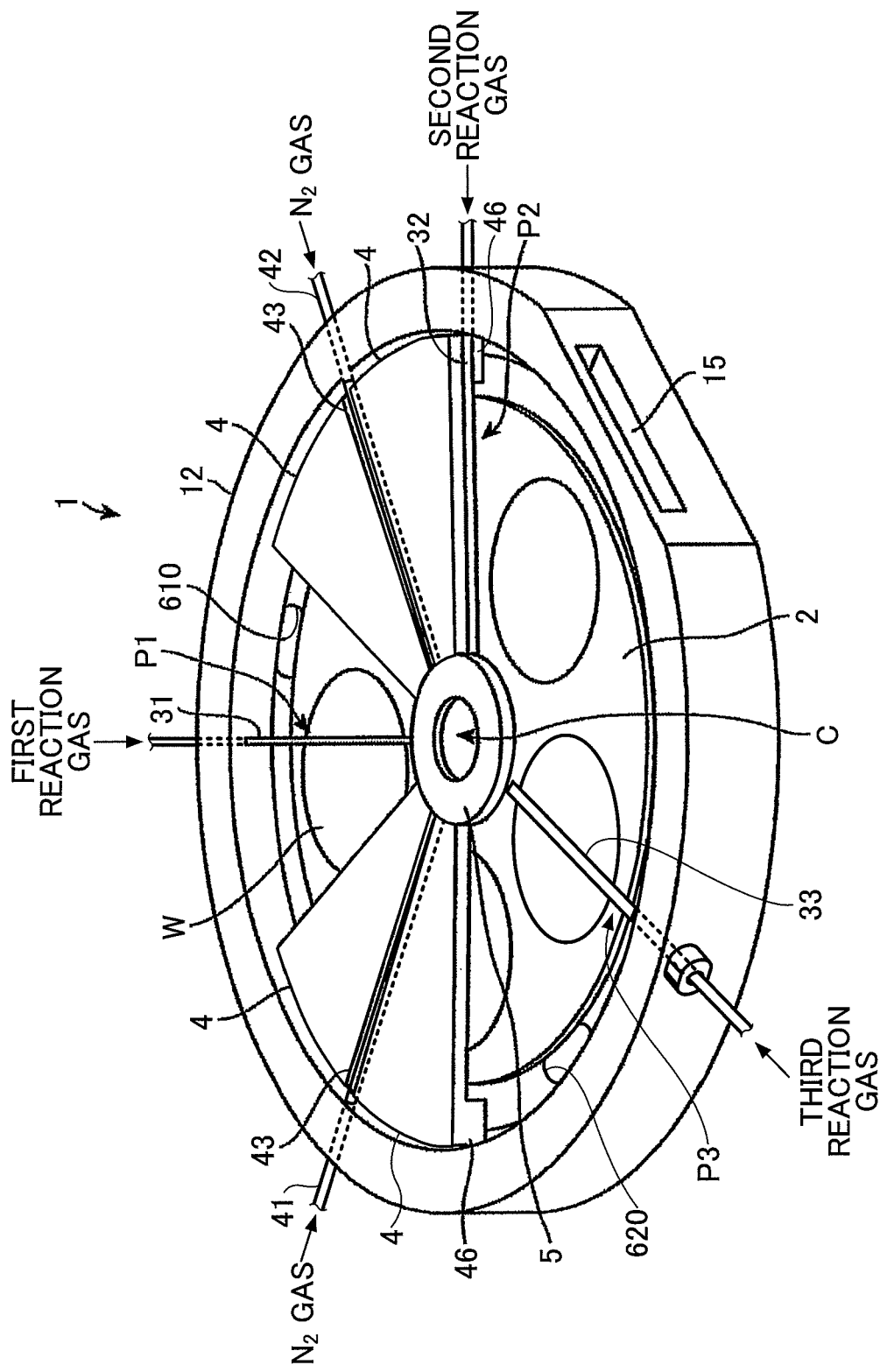
FIG. 2 is a schematic perspective view illustrating an inside structure of a vacuum chamber of the film deposition apparatus illustrated in FIG. 1.
Figure 3:
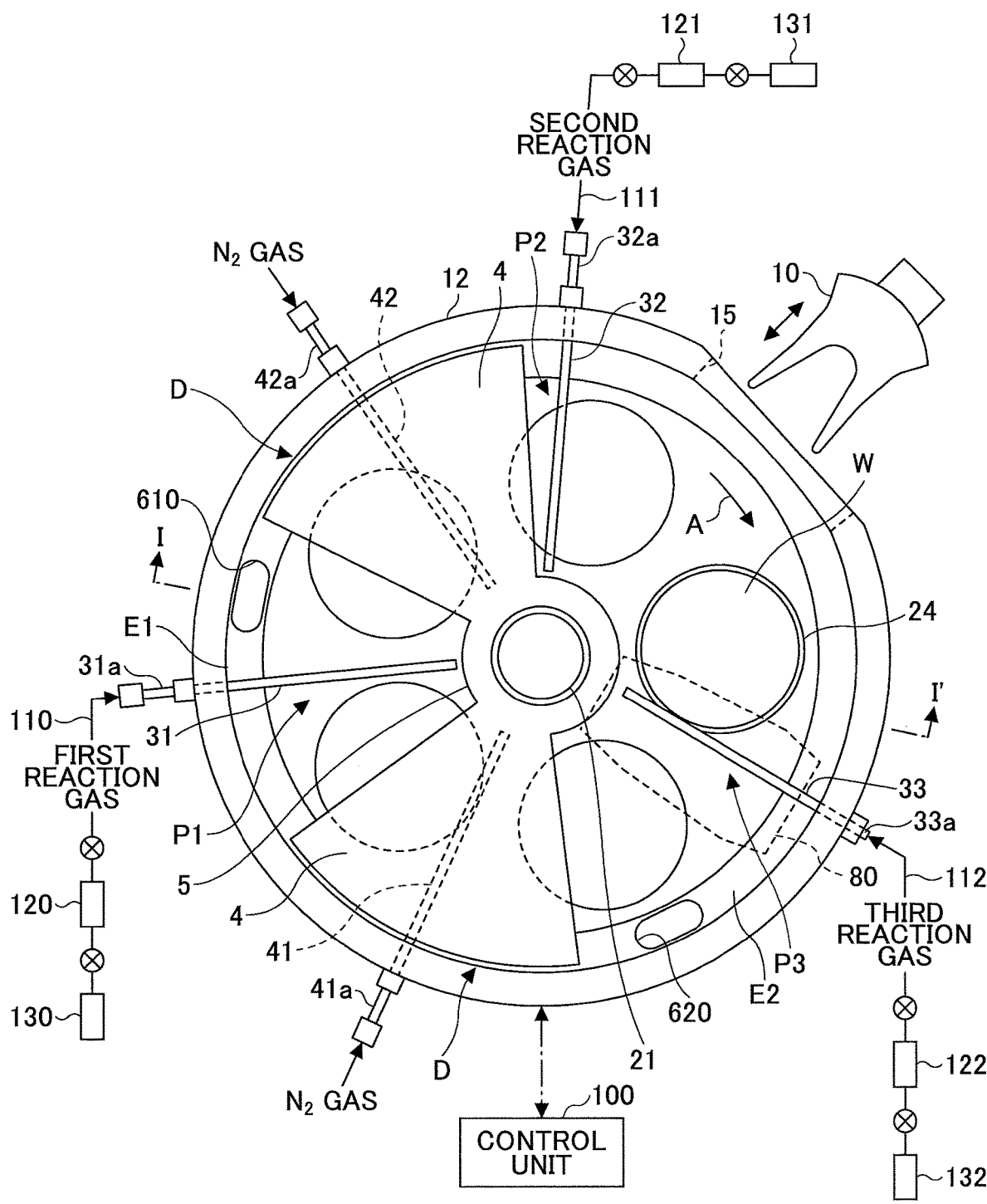
FIG. 3 is a schematic top view illustrating an example of the vacuum chamber of the film deposition apparatus illustrated in FIG. 1.

To begin with, a film deposition apparatus according to an embodiment of the present invention is described below. With reference to FIGS. 1 through 3, the film deposition apparatus includes a vacuum chamber 1 having a substantially flat circular shape, and a turntable 2 having a rotational axis coincident with the center of the vacuum chamber 1. The vacuum chamber 1 is a process chamber to contain a wafer therein and to perform a film deposition process on a surface of the wafer. The vacuum chamber 1 includes a chamber body 12 having a cylindrical shape with a bottom surface, and a ceiling plate 11 placed on the upper surface of the chamber body 12. The ceiling plate 11 is detachably placed on the chamber body 12 via a sealing member 13 (FIG. 1) such as an O-ring in an airtight manner.

The turntable 2 is provided in the vacuum chamber 1. The turntable 2 is attached to a cylindrical shaped core unit 21 at its center portion. The core unit 21 is fixed to the upper end of a rotary shaft 22 that extends in the vertical direction. The rotary shaft 22 is provided to penetrate the bottom portion 14 of the vacuum chamber 1 and its lower end is attached to a driving unit 23 that rotates the rotary shaft 22 (FIG. 1) about a vertical axis. The rotary shaft 22 and the driving unit 23 are housed in the cylindrical case body 20 whose upper surface is open. The case body 20 is attached to a lower surface of the bottom portion 14 of the vacuum chamber 1 via a flange portion provided at its upper surface in an airtight manner so that inner atmosphere of the case body 20 is isolated from outside atmosphere.

As illustrated in FIGS. 2 and 3, a plurality of (five in the example of the drawing) circular concave portions 24 is provided at a top surface of the turntable 2 along a rotating direction (circumferential direction) to receive the plurality of semiconductor wafers (which will be simply referred to as "wafers" hereinafter) W, respectively. In FIG. 3, only a single wafer W is illustrated in one of the concave portions 24 for an explanatory purpose. Each of the concave portions 24 is formed to have a slightly larger (for example, 4 mm larger) diameter than that (for example, 300 mm) of the wafer W, and a depth substantially equal to the thickness of the wafer W. Thus, when the wafer W is placed in the respective concave portion 24, the surface of the wafer W and the surface of the turntable 2 (where the wafer W is not placed) become almost the same height. Each of the concave portions 24 has three, for example, through holes formed in the bottom, through which lift pins for supporting a back surface of the respective wafer W and lifting the wafer W penetrate.

FIGS. 2 and 3 are diagrams for explaining an inside structure of the vacuum chamber 1. The ceiling plate 11 is not illustrated in FIG. 2 and FIG. 3 for an explanatory purpose. As illustrated in FIGS. 2 and 3, a reaction gas nozzle 31, a reaction gas nozzle 32, a reaction gas nozzle 33, separation gas nozzles 41 and 42, which are made of quartz, for example, are provided above the turntable 2. In the example illustrated in FIG. 3, the separation gas nozzle 41, the reaction gas nozzle 31, the separation gas nozzle 42, and the reaction gas nozzle 32, and the reaction gas nozzle 33 are arranged in this order from a transfer port 15 (which will be explained later) in a clockwise direction (the rotation direction of the turntable 2 as illustrated by an arrow A in FIG. 3) with a space therebetween in a circumferential direction of the vacuum chamber 1. Gas introduction ports 31a, 32a, 33a, 41a, and 42a (FIG. 3) that are base portions of the nozzles 31, 32, 33, 41, and 42, respectively, are fixed to an outer peripheral wall of the chamber body 12 so that these nozzles 31, 32, 33, 41, and 42 are introduced into the vacuum chamber 1 from the outer peripheral wall of the vacuum chamber 1 so as to extend in a radial direction and parallel to the surface of the turntable 2.

In this embodiment, as illustrated in FIG. 3, the reaction gas nozzle 31 is connected to a supplying source 130 (not illustrated in the drawings) of a first reaction gas via a pipe 110, a flow controller 120 and the like (not illustrated in the drawings). The reaction gas nozzle 32 is connected to a supplying source 131 (not illustrated in the drawings) of a second reaction gas via a pipe 111, a flow controller 121 and the like (not illustrated in the drawings). The reaction gas nozzle 33 is connected to a supplying source 132 (not illustrated in the drawings) of a halogen-containing gas (ClF$_3$, F$_2$, Nf$_3$, CF$_4$, BCl$_3$, HCL and the like) via a pipe 112, a flow controller 122 and the like (not illustrated in the drawings). The separation gas nozzles 41 and 42 are connected to supplying sources (not illustrated in the drawings) of a separation gas via pipes and flow controller valves and the like, respectively. A noble gas such as helium (He) or argon (Ar) or inert gas such as nitrogen (N$_2$) gas can be used as the separation gas. The present embodiment is described by citing an example of using N$_2$ gas as the separation gas.

Each of the reaction gas nozzles 31, 32 and 33 has a plurality of gas discharge holes 35 (see FIG. 4) that faces downward to the turntable 2 along the longitudinal directions of each of the reaction gas nozzles 31, 32 and 33 at intervals of 10 mm, for example. An area below the reaction gas nozzle 31 is a first process area P1 in which the first reaction gas is adsorbed onto the wafers W. An area below the reaction gas nozzle 32 is a second process area P2 in which the second reaction gas that reacts with the first reaction gas adsorbed on the wafer W is supplied, thereby producing a molecular layer of a reaction product. The molecular layer of the reaction product constitutes a film to be deposited. An area below the reaction gas nozzle 33 is a third process area F3 in which a halogen-containing gas is supplied to the reaction product (film) produced in the second process area P2, thereby forming an adsorption blocking group. Here, because the first process area P1 is an area where the first reaction gas, which is a source gas, is supplied, the first process area P1 may be referred to as a first reaction gas supply area P1 or source gas supply area P1. Similarly, because the second process area is an area where the reaction gas, which is an reaction gas reactable with the source gas and capable of producing the reaction product, is supplied, the second process area P2 may be referred to as a second reaction gas supply are P2 or reaction gas supply area P2. Also, the third process area P3 is an area where the third gas, which is a halogen-containing gas, is supplied, the third process area P3 may be referred to as a third reaction gas supply area P3 or halogen gas supply area P3.

A plasma generator 80 may be provided above the third process area P3 as necessary. In FIG. 3, the plasma generator is simply illustrated by a dotted line for an explanatory purpose. A detail of the plasma generator 80 is described later.

Although the first reaction gas may be a variety of gases, in general, a source gas that becomes a source of a film to be deposited is selected. For example, when a metal oxide film is deposited, a reaction gas containing a metal element of the metal oxide film is selected. For example, when a $TiO_2$ film that is one of the metal oxide films is deposited, $TiCl_4$ gas or the like containing Ti is selected.

A variety of reaction gases can be used as the second reaction gas as long as the second gas is a reaction gas capable of producing a reaction product by reacting with the first reaction gas. For example, an oxide gas is selected as the second reaction gas when a metal oxide film is deposited, and a nitriding gas is selected as the second reaction gas when a metal nitriding film is deposited. For example, $H_2O$, $H_2O_2$ or the like is selected when a $TiO_2$ film is deposited, and $NH_3$ or the like is selected when a TiN film is deposited.

A variety of gas containing a halogen element can be used as the halogen-containing gas (third process gas). For example, a fluorine-containing gas containing fluorine, a chlorine-containing gas containing chlorine and the like can be used. The halogen-containing gas plays a role in forming an adsorption blocking group that blocks the first process gas, which is the source gas, from adsorbing on a surface of a wafer W. For example, a recessed pattern such as a via hole and a trench is formed in the surface of the wafer W, by forming the adsorption blocking group on the surface of the wafer W or on an upper portion of the recessed pattern, the film thickness does not become thick at the upper portion of the recessed pattern while becoming thick on the bottom and therearound, which makes it possible to perform high bottom-up film deposition. The adsorption blocking group needs to be a gas that does not react with the first reaction gas (source gas), and the halogen-containing gas can be preferably used when a metal oxide film or metal nitriding film is deposited.

For example, $ClF_4$, $F_2$, $NF_3$, $CF_4$ and the like can be used as the fluorine-containing gas. Also, for example, $BCl_3$, HCl and the like can be used as the chlorine-containing gas. Moreover, another halogen gas can be properly used depending on the intended purpose.

When the recessed pattern such as the via and trench is formed in the surface of the wafer W, and the halogen-containing gas is supplied to form the adsorption blocking group, the halogen-containing gas is supplied at a predetermined flow rate or lower so that the halogen-containing gas does not reach the bottom surface of the recessed pattern. In other words, when the halogen-containing gas goes up to the bottom portion of the recessed pattern, the adsorption of the source gas is blocked on the entire surface of the recessed pattern and the goal of performing the high bottom-up film deposition cannot be achieved, which just result in the supply for decreasing the throughput. Hence, the flow rate control is performed so as to set the flow rate of the halogen-containing gas from the reaction gas nozzle 33 equal to or lower than the predetermined flow rate, or lower than the predetermined flow rate by using the flow controller 122.

Referring to FIGS. 2 and 3, the ceiling plate 11 includes two convex portions 4 protruding in the vacuum chamber 1. As will be explained later, the protruding portions are attached to a lower surface of the ceiling plate 11 so as to protrude toward the turntable 2 to form separation areas D with the corresponding separation gas nozzles 41 and 42. Each of the convex portions 4 has substantially a fan-like top view shape where the apex is removed in an arc shape. For each of the convex portions 4, the inner arc shaped portion is connected to a protruding portion 5 (which will be explained later) and the outer arc shaped portion is formed to extend along an inner peripheral surface of the chamber body 12 of the vacuum chamber 1.

Figure 4:
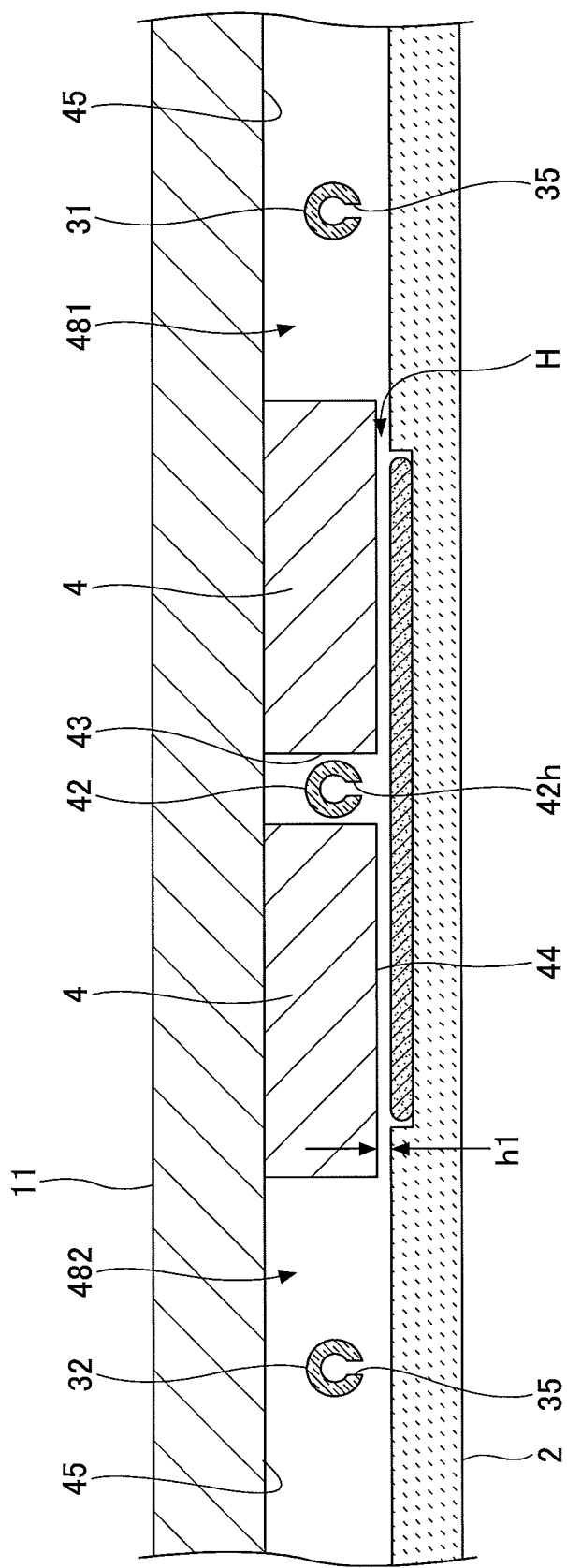
FIG. 4 is a schematic partial cross-sectional view of an example of the film deposition apparatus illustrated in FIG. 1.

FIG. 4 illustrates a cross-section of the vacuum chamber 1 along a concentric circle of the turntable 2 from the reaction gas nozzle 31 to the reaction gas nozzle 32. As illustrated in FIG. 4, the convex portion 4 is fixed to the lower surface of the ceiling plate 11. Thus, there are provided a flat low ceiling surface 44 (first ceiling surface) formed as the lower surface of the convex portion 4 and flat higher ceiling surfaces 45 (second ceiling surfaces) which are higher than the low ceiling surface 44 and formed on both sides of the low ceiling surface 44 in the circumferential direction. The low ceiling surface 44 has substantially a fan-like top view shape where the apex is removed in an arc shape. Furthermore, as illustrated in the drawings, the convex portion 4 includes a groove portion 43 at a center in the circumferential direction. The groove portion 43 is formed to extend in the radial direction of the turntable 2. The separation gas nozzle 42 is housed in the groove portion 43. Although not illustrated in FIG. 4, the separation gas nozzle 41 is also housed in a groove portion provided in the other convex portion 4. The reaction gas nozzles 31 and 32 are provided in spaces below the high ceiling surfaces 45, respectively. The reaction gas nozzles 31 and 32 are provided in the vicinity of the wafers W apart from the high ceiling surfaces 45, respectively. Here, the reaction gas nozzle 31 is provided in a space 481 below and on the right side of the high ceiling surface 45, and the reaction gas nozzle 32 is provided in a space 482 below and on the left side of the high ceiling surface 45.

Each of the separation gas nozzles 41 and 42 has a plurality of gas discharge holes 42h formed along the longitudinal direction thereof at a predetermined interval (10 mm, for example).

The low ceiling surface 44 provides a separation space H, which is a narrow space, with respect to the turntable 2. When $N_2$ gas is supplied from the separation gas nozzle 42 to the separation space H, this $N_2$ gas flows toward the space 481 and the space 482 through the separation space H. On this occasion, because the volume of the separation space H is smaller than those of the spaces 481 and 482, the pressure in the separation space H can be made higher than those in the spaces 481 and 482 by $N_2$ gas. It means that the separation space H having the higher pressure is formed between the spaces 481 and 482. Moreover, $N_2$ gas flowing from the separation space H toward the spaces 481 and 482 functions as a counter flow against the first reaction gas from the gas first process area P1 and the second reaction gas from the second process area P2. Thus, the first reaction gas from the first process area P1 is separated from the second reaction gas from the second process area P2 by the separation space H. Therefore, mixing and reacting of the first reaction gas with the second reaction gas are prevented in the vacuum chamber 1.

The height h1 of the low ceiling surface 44 above an upper surface of the turntable 2 is preferred to be appropriately determined based on the pressure of the vacuum chamber 1 during the film deposition, the rotational speed of the turntable 2, and a supplying amount of the separation gas ($N_2$ gas) in order to maintain the pressure in the separation space H higher than those in the spaces 481 and 482.

Referring to FIGS. 1 through 3, the ceiling plate 11 further includes the protruding portion 5 at its lower surface to surround the outer periphery of the core unit 21 which fixes the turntable 2. The protruding portion 5 is continuously formed with the inner portions of the convex portions 4 and has a lower surface which is formed at the same height as those of the low ceiling surfaces 44, in this embodiment.

Figure 5:
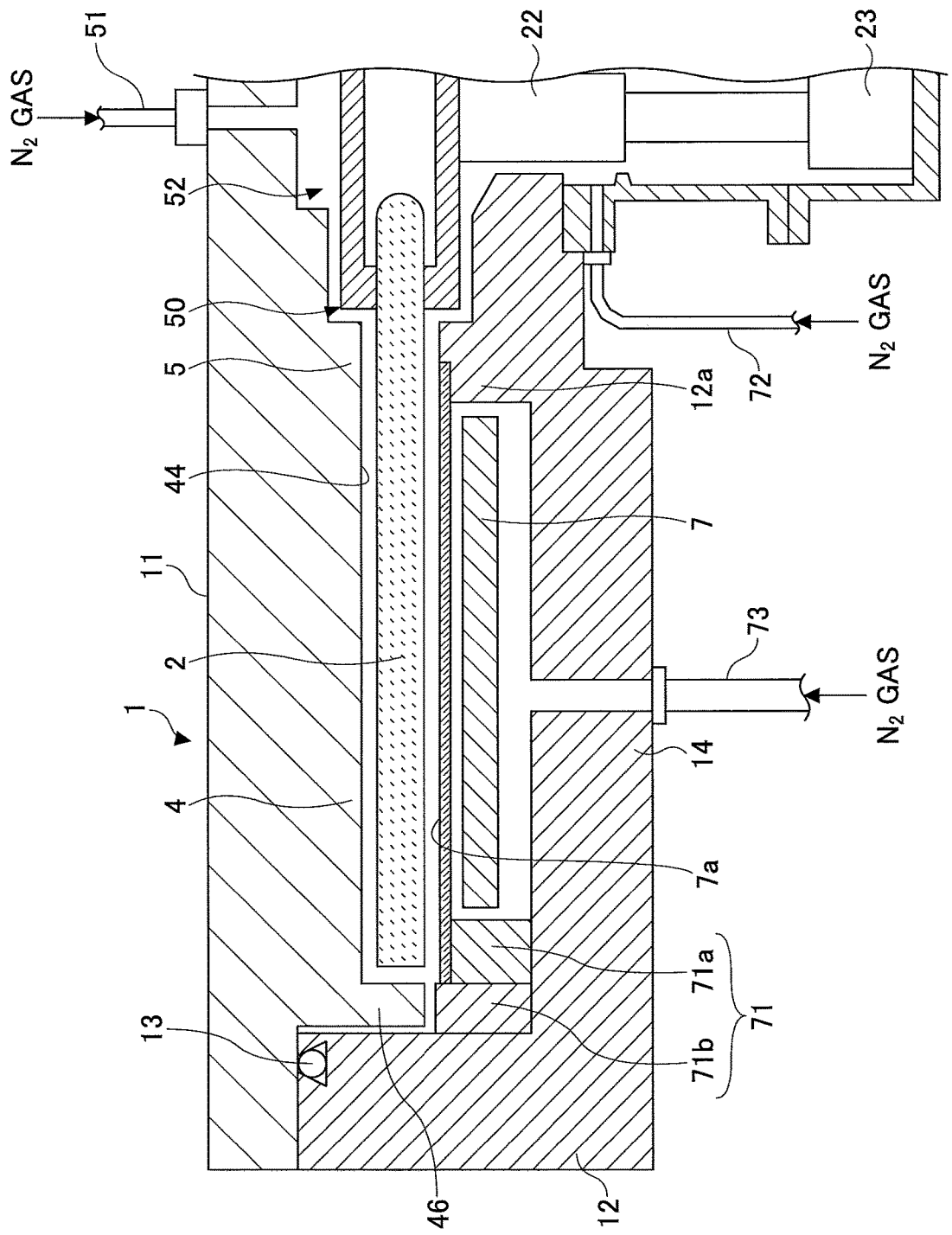
FIG. 5 is another schematic cross-sectional view of the film deposition apparatus illustrated in FIG. 1

FIG. 1 is a cross-sectional view taken along an I-I' line in FIG. 3, and illustrating an area where the ceiling surface 45 is provided. FIG. 5 is a partial cross-sectional view illustrating an area where the ceiling surface 44 is provided. As illustrated in FIG. 5, the convex portion 4 having a substantially fan-like top view shape includes an outer bending portion 46 at its outer peripheral end portion (at an outer peripheral end portion side of the vacuum chamber 1) which is bent to have an L-shape to face an outer end surface of the turntable 2. The outer bending portion 46 suppresses a flow of gas between the space 481 and the space 482 through the space between the turntable 2 and the inner peripheral surface of the chamber body 12. As described above, the convex portions 4 are provided on the ceiling plate 11 which is detachably attached to the chamber body 12. Thus, there is a slight space between the outer periphery surface of the outer bending portion 46 and the chamber body 12. The spaces between the inner periphery surface of the outer bending portion 46 and an outer surface of the turntable 2, and the space between the outer periphery surface of the outer bending portion 46 and the chamber body 12 are set at the same size as the height h1 (see FIG. 4) of the low ceiling surface 44 with respect to the upper surface of the turntable 2, for example.

As illustrated in FIG. 5, the inner peripheral wall of the chamber body 12 is provided to extend in a vertical direction to be closer to the outer peripheral surface of the outer bending portion 46 at the separation area H. However, other than the separation area H, as illustrated in FIG. 1, for example, the inner peripheral wall of the chamber body 12 is formed to have a concave portion recessed outward from a location facing the outer end surface of the turntable 2 to the upper end of the bottom portion 14. Hereinafter, for an explanatory purpose, the concave portion, having a substantially rectangular cross-sectional view, is referred to as an "evacuation area". Specifically, a part of the evacuation area which is in communication with the first process area P1 is referred to as a first evacuation area E1, and a part of the evacuation area which is in communication with the second and third process areas P2 and P3 is referred to as a second evacuation area E2. As illustrated in FIGS. 1 through 3, a first evacuation port 610 and a second evacuation port 620 are respectively provided at the bottom portions of the first evacuation area E1 and the second evacuation area E2. The first evacuation port 610 and the second evacuation port 620 are connected to vacuum pumps 640, which are vacuum evacuation units, via evacuation pipes 630, respectively, as illustrated in FIG. 1. Moreover, a pressure regulator 650 is provided between the vacuum pumps 640 and the evacuation pipes in FIG. 1.

The heater unit 7 is provided at a space between the turntable 2 and the bottom portion 14 of the vacuum chamber 1 as illustrated in FIG. 1 and FIG. 5. The wafers W mounted on the turntable 2 are heated by the heater unit 7 via the turntable 2 to a temperature (450° C., for example) determined by a process recipe. A ring cover member 71 is provided at a lower portion side of the outer periphery of the turntable 2 in order to prevent gasses from being introduced into the space below the turntable 2.

As illustrated in FIGS. 2 and 3, although the separation area H is not provided between the second and third process areas P2 and P3, in FIG. 3, a housing for partitioning the space above the turntable 2 is provided in the area shown as the plasma generator 80. Such a housing serves as an area on which the plasma generator 80 is mounted, but even when the plasma generator 80 is not mounted thereon, the housing is preferably provided to partition the space above the turntable 2 into the second process area P2 and the third process area P3. This point will be described later in detail.

As illustrated in FIGS. 1 and 5, a heater unit 7, which is a heating device, is provided in a space between the bottom portion 14 of the vacuum chamber 1 and the turntable 2, and heats a wafer W on the turntable 2 via the turntable 2 up to a temperature determined by a process recipe (e.g., 200 degrees C.). As illustrated in FIG. 5, a ring-shaped cover member 71 is provided below, at and near the periphery of the turntable 2 to prevent a gas from entering an area under the turntable 2 by separating an atmosphere from a space above the turntable 2 to the evacuation areas E1 and E2 from an atmosphere in which the heater unit 7 is placed. The cover member 71 includes an inner member 71a provided under the periphery and outside of the turntable 2 and an outer member 71b provided between the inner member 71a and the inner side wall of the vacuum chamber 1. The outer member 71b is provided to face the outer bending portion 46, which is formed at an outer edge portion at lower side of each of the convex portions 4. The inner member 71a is provided to surround the entirety of the heater unit 7 below the outer end portion (and at a slightly outer side of the outer edge portion) of the turntable 2.

The bottom portion 14 of the vacuum chamber 1 closer to the rotation center than the space where the heater unit 7 is provided protrudes upward to be close to the core unit 21 to form a projecting portion 12a. There is provided a narrow space between the projecting portion 12a and the core unit 21. Furthermore, there is provided a narrow space between an inner peripheral surface of the bottom portion 14 and the rotary shaft 22 to be in communication with the case body 20. A purge gas supplying pipe 72 which supplies $N_2$ gas as the purge gas to the narrow space for purging is provided in the case body 20. The bottom portion 14 of the vacuum chamber 1 includes a plurality of purge gas supplying pipes 73 (only one of the purge gas supplying pipes 73 is illustrated in FIG. 5) which are provided at a predetermined angle interval in the circumferential direction below the heater unit 7 for purging the space where the heater unit 7 is provided. Moreover, a cover member 7a is provided between the heater unit 7 and the turntable 2 to prevent the gas from going into the space where the heater unit 7 is provided. The cover member 7a is provided to extend from an inner peripheral wall (upper surface of the inner member 71a) of the outer member 71b to an upper end portion of the projecting portion 12a in the circumferential direction. The cover member 7a may be made of quartz, for example.

The heater unit 7 heats the wafer W up to a predetermined temperature that does not cause the halogen gas supplied to the surface of the wafer W to perform etching action, or lower than the predetermined temperature. More specifically, when the wafer W is heated to a high temperature, the halogen gas exerts its etching action and does not adsorb on a thin film but etches the thin film, thereby preventing the film deposition. Hence, after the heating temperature is set to the predetermined temperature that does not cause the etching action, the wafer W is heated.

The film deposition apparatus 1 further includes a separation gas supplying pipe 51 that is connected to a center portion of the ceiling plate 11 of the vacuum chamber 1 and provided to supply $N_2$ gas as the separation gas to a space 52 between the ceiling plate 11 and the core unit 21. The separation gas supplied to the space 52 flows through a narrow space between the protruding portion 5 and the turntable 2 so as to flow along the top surface of the turntable 2 where the wafers W are to be placed and is discharged toward the outer periphery. The space 50 is kept at a pressure higher than those of the space 481 and the space 482 by the separation gas. Thus, the mixing of the first reaction gas such as TiCl$_4$ supplied to the first process area P1 and the second reaction gas such as H$_2$O supplied to the second process area P2 by flowing through the center area C can be prevented by the space 50. It means that the space 50 (or the center area C) can function similarly to the separation space H (or the separation area D).

In addition, as illustrated in FIGS. 2 and 3, a transfer port 15 is formed in a side wall of the vacuum chamber 1 for allowing the wafers W, which are substrates, to pass between an external transfer arm 9 and the turntable 2. The transfer port 15 is opened and closed by a gate valve (not illustrated in the drawings). Furthermore, lift pins, which penetrate through the concave portion 24 to lift up the wafer W from a backside surface, and a lifting mechanism for the lift pins (both are not illustrated in the drawings) are provided at a location where the wafer W is transferred and below the turntable 2 because the wafer W is transferred between the external transfer arm 9 and the concave portion 24 of the turntable 2, which is a substrate receiving area, at a location facing the transfer port 15.

Figure 6:
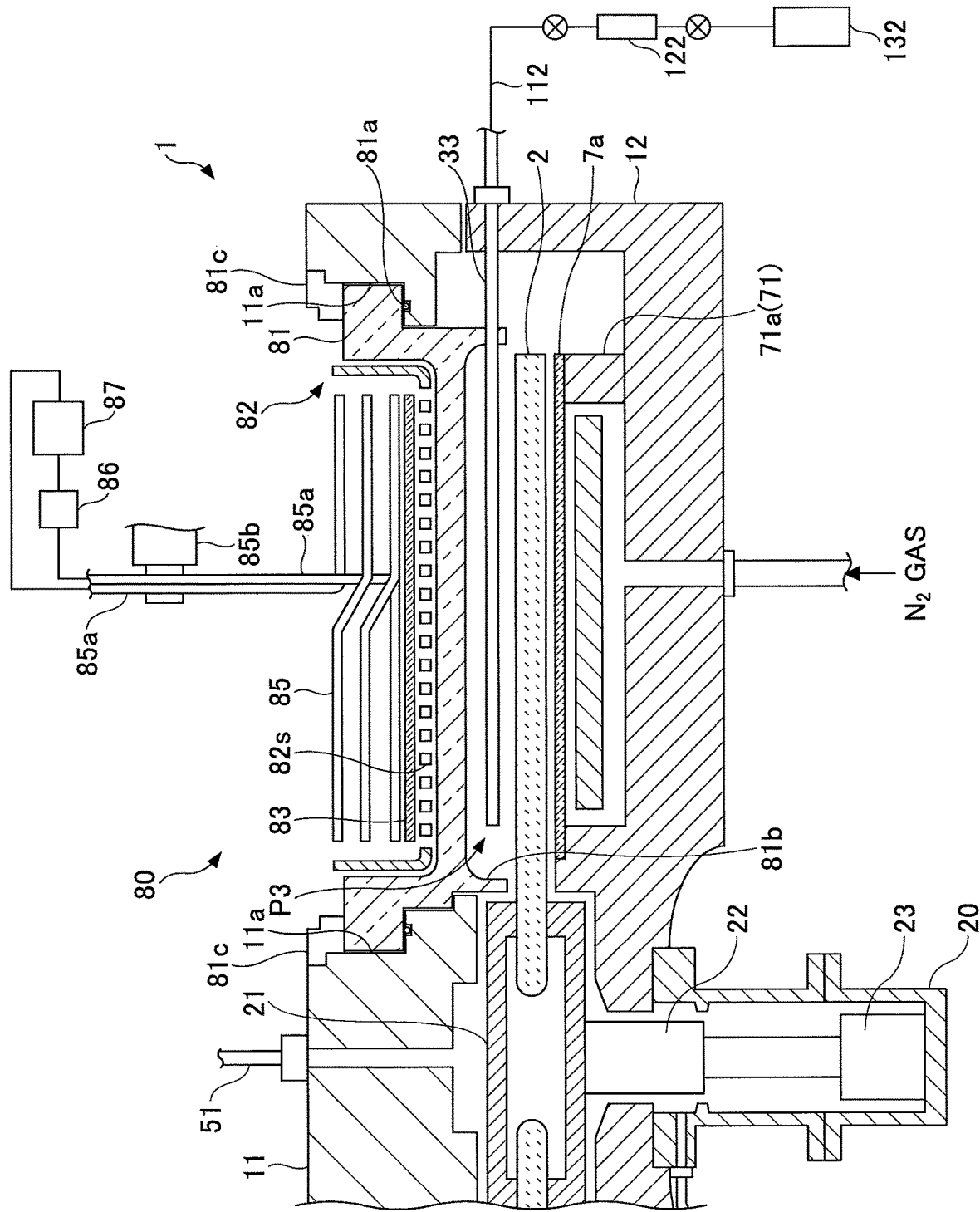
FIG. 6 is a schematic cross-sectional view of an example of a plasma generator provided in the film deposition apparatus illustrated in FIG. 1.
Figure 7:
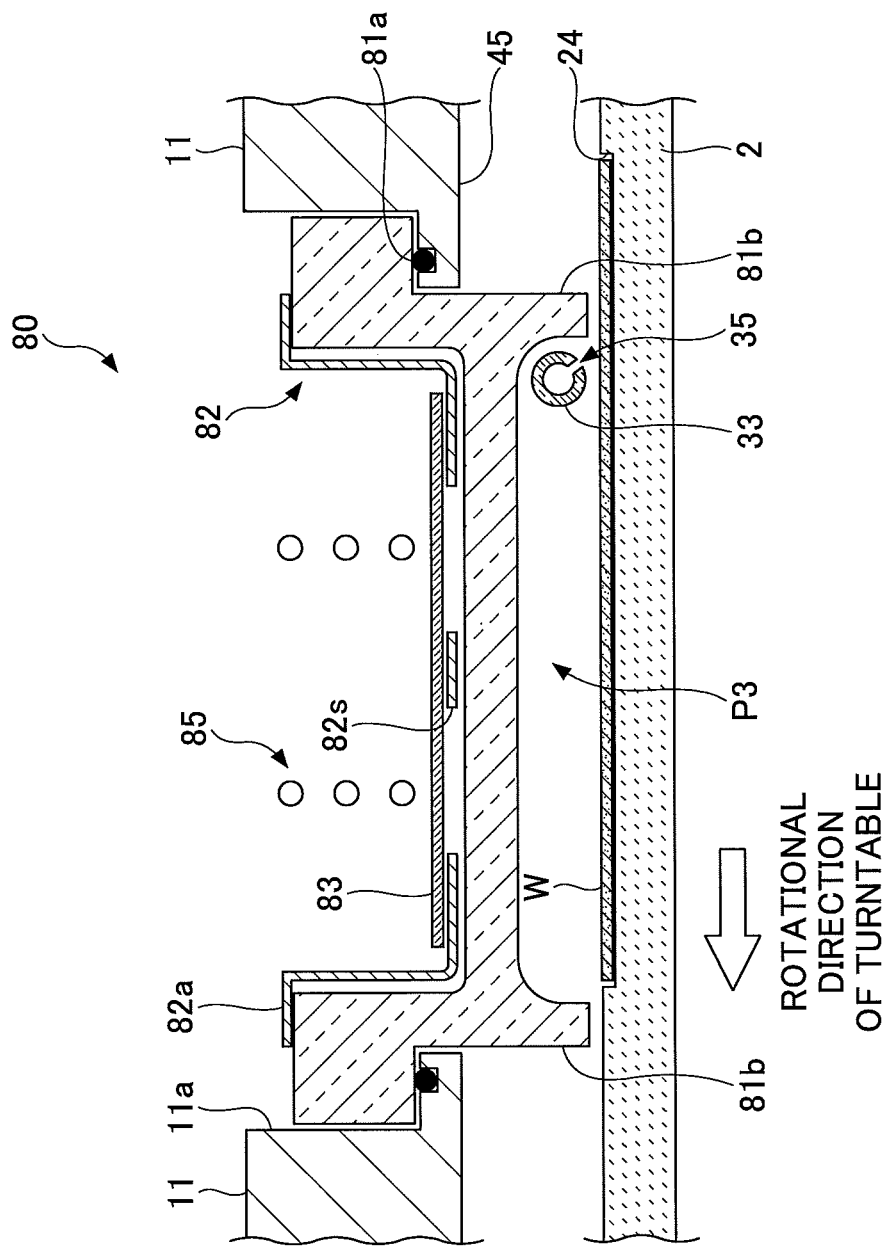
FIG. 7 is another schematic cross-sectional view of the plasma generator illustrated in FIG. 6.
Figure 8:
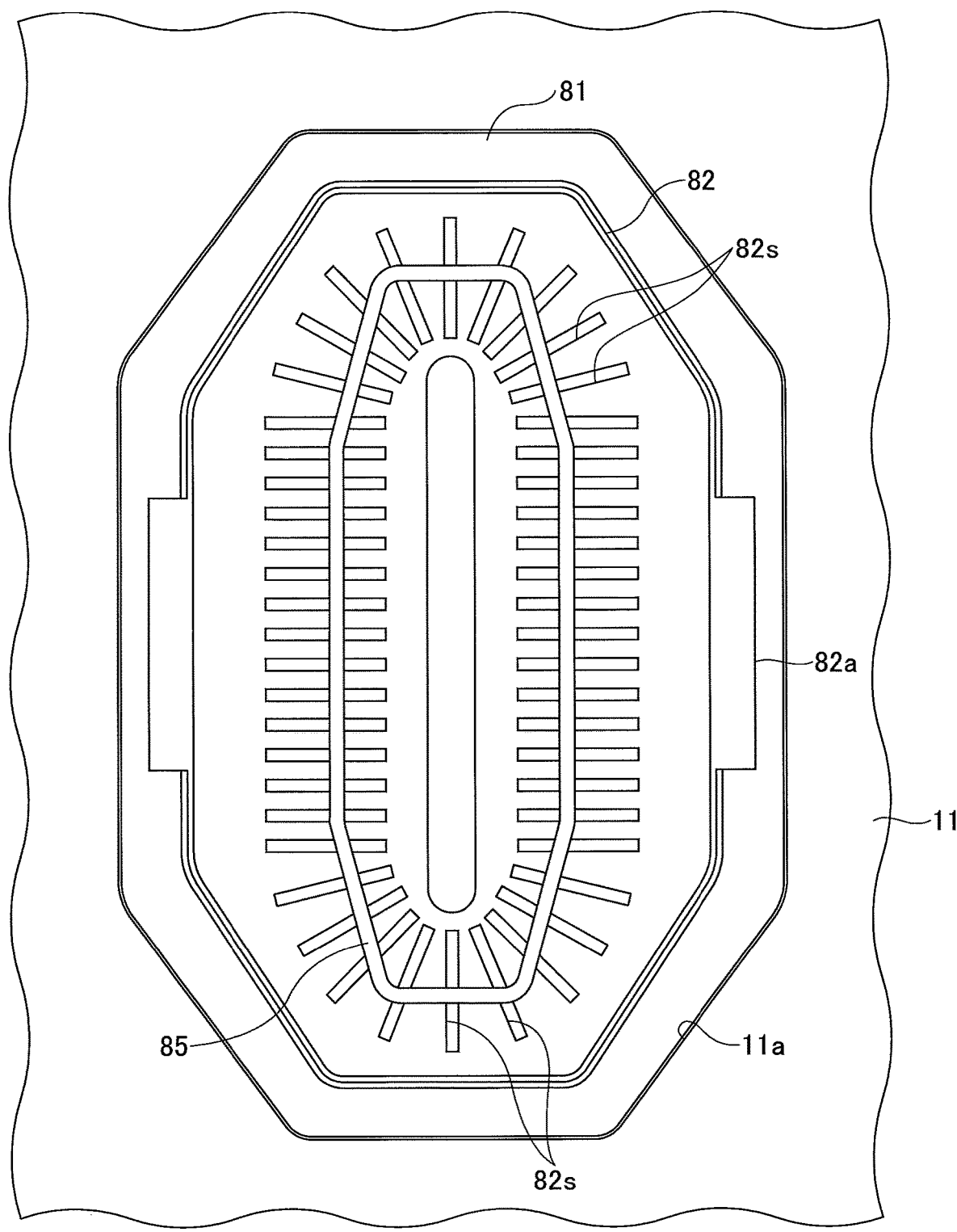
FIG. 8 is a schematic top view of the plasma generator illustrated in FIG. 6.

Next, the plasma generator 80 is explained with reference to FIGS. 6 through 8. FIG. 6 is a schematic cross-sectional view of the plasma generator 80 taken along the radial direction of the turntable 2. FIG. 7 is a schematic cross-sectional view of the plasma generator 80 taken along a direction perpendicular to the radial direction of the turntable 2. FIG. 8 is a schematic top view illustrating the plasma generator 80. For an explanatory purpose, parts of the components are not illustrated in the drawings.

Referring to FIG. 6, the plasma generator 80 is made of a material that transmits radio frequency waves, and has a concave portion in its upper surface. The plasma generator 80 further includes a frame member 81 that is embedded in an opening 11a provided in the ceiling plate 11, a Faraday shield plate 82 housed in the concave portion of the frame member 81 and having substantially a box shape whose top is opened, an insulating plate 83 placed on a bottom surface of the Faraday shield plate 82, and a coil antenna 85 supported by the insulating plate 83 thereon. The antenna 85 has substantially an octagonal upper plane shape.

The opening 11a of the ceiling plate 11 is formed to have a plurality of step portions, and one of the step portions has a groove portion to extend along the perimeter where a sealing member 81a such as an O-ring or the like is embedded. The frame member 81 is formed to have a plurality of step portions that correspond to the step portions of the opening 11a, and when the frame member 81 is engaged in the opening 11a, a back side surface of one of the step portions contacts the sealing member 81a embedded in the opening 11a so that the ceiling plate 11 and the frame member 81 are kept in an air-tight manner. Moreover, as illustrated in FIG. 6, a pushing member 81c, which extends along the outer peripheral of the frame member 81 that is fitted in the opening 11a of the ceiling plate 11, is provided so that the frame member 81 is pushed downward with respect to the ceiling plate 11. Thus, the ceiling plate 11 and the frame member 81 are further kept in an air-tight manner.

The lower surface of the frame member 81 is positioned to face the turntable 2 in the vacuum chamber 1 and a projection portion 81b that projects downward (toward the turntable 2) is provided at the perimeter at the lower surface. The lower surface of the projection portion 81b is close to the surface of the turntable 2 and a space (hereinafter referred to as the third process area P3) is surrounded by the projection portion 81b, the surface of the turntable 2 and the lower surface of the frame member 81 above the turntable 2. The space between the lower surface of the projection portion 81b and the surface of the turntable 2 may be the same as the height h1 between the ceiling surface 44 and the upper surface of the turntable 2 in the separation space H (FIG. 4).

In addition, the reaction gas nozzle 33 that penetrates through the projection portion 81b is provided in the third process area P3. In this embodiment, as illustrated in FIG. 6, the halogen-containing gas supplying source 132 filled with a halogen-containing gas such as ClF$_3$ is connected to the reaction gas nozzle 33 by the pipe 112 through the flow controller 122. The halogen-containing gas whose flow rate is controlled by the flow controller 122 is supplied to the third process area P3 at a predetermined flow rate. When the halogen-containing gas is supplied while being converted to plasma by using the plasma generator 80, because the halogen-containing gas is unlikely to reach the bottom portion of the recessed pattern of the wafer W, the halogen-containing gas can be supplied at a usual flow rate.

The reaction gas nozzle 33 has a plurality of gas discharge holes 35 formed along the longitudinal direction thereof at a predetermined interval (10 mm, for example), and the above-mentioned halogen-containing gas and the like are discharged from the gas discharge holes 35. As illustrated in FIG. 7, the gas discharge holes 35 are provided to be inclined from a vertical direction with respect to the turntable 2 toward the upstream rotation direction of the turntable 2. Due to this, the gas supplied from the reaction gas nozzle 33 is discharged in a direction opposite to the rotational direction of the turntable 2, specifically, toward a space between a lower surface of the projection portion 81b and the surface of the turntable 2. Thus, the flows of the reaction gas and the separation gas from a space below the ceiling surface 45 that is upstream of the plasma generator 80 toward the third process area P3 along the rotation direction of the turntable 2 can be prevented. Furthermore, as described above, because the projection portion 81b that is formed along an outer periphery of the lower surface of the frame member 81 is close to the surface of the turntable 2, the pressure in the third process area can be kept high by the gas from the reaction gas nozzle 33. This also prevents the reaction gas and the separation gas from flowing into the third process area P3.

Thus, the frame member 81 plays a role in separating the third process area P3 from the second process area P2. Hence, although the film deposition apparatus according to the embodiments does not have to include the whole of the plasma generator 80, the film deposition apparatus according to the embodiments includes the frame member 81 to separate the third process area P3 from the second process area P2 and to prevent the second reaction gas being mixed into the third process gas.

The Faraday shield plate 82 is made of a conductive material such as a metal and is grounded, although not illustrated in the drawings. As clearly illustrated in FIG. 8, the Faraday shield plate 82 has a plurality of slits 82s at its bottom portion. Each of the slits 82s is extending to be substantially perpendicular to a corresponding side of the antenna 85 that has the substantially octagonal plane shape.

As illustrated in FIGS. 7 and 8, the Faraday shield plate 82 includes two support portions 82a that are provided at upper end portions to bend outward. The support portions 82a are supported by the upper surface of the frame member 81 so that the Faraday shield plate 82 is supported at a predetermined position in the frame member 81.

The insulating plate 83 is made of fused quartz, for example, has a size slightly smaller than that of the bottom surface of the Faraday shield plate 82, and is mounted on the bottom surface of the Faraday shield plate 82. The insulating plate 83 insulates the Faraday shield plate 82 from the antenna 85 while passing the radio frequency waves radiated from the antenna 85 downward.

The antenna 85 is formed by winding a pipe made of copper three times, for example, in a substantially octagonal plane shape. Thus, cooling water can be circulated in the pipe, and the antenna 85 is prevented from being heated to be a high temperature by the radio frequency waves supplied to the antenna 85. As illustrated in FIG. 6, the antenna 85 includes a standing portion 85a to which a support portion 85b is attached. The antenna 85 is maintained at a predetermined position in the Faraday shield plate 82 by the support portion 85b. The radio frequency power source 87 is connected to the support portion 85b via the matching box 86. The radio frequency power source 87 is capable of generating radio frequency waves of 13.56 MHz, for example.

According to the plasma generator 80 thus structured, when the radio frequency waves are supplied to the antenna 85 from the radio frequency power source 87 via the matching box 86, an electromagnetic field is generated by the antenna 85. In the electromagnetic field, the electric field component is shielded by the Faraday shield plate 82 so as not to be transmitted downward. On the other hand, the magnetic field component is transmitted into the third process area P3 through the plurality of slits 82s of the Faraday shield plate 82. The halogen-containing gas supplied to the third process area P3 from the reaction gas nozzle 33 at a predetermined flow ratio is activated by the magnetic field component. Here, the supply of the halogen-containing gas is intended to cause the halogen-containing gas to adsorb on an upper portion of the recessed pattern of the wafer W so as to form an adsorption blocking group on the upper portion of the recessed pattern, but is not intended to etch the film. Hence, converting the halogen-containing gas to plasma is performed in a range that does not cause an F-containing gas and the like to exert the etching action. By using the plasma generated in this manner, it is possible to form the adsorption blocking group against the source gas by causing the F-containing gas and the like to adsorb on the upper portion of the recessed pattern formed in the surface of the wafer W such as a via and a trench, and to perform film deposition from the bottom portion where the adsorption of the source gas is not blocked by the adsorption blocking group.

As illustrated in FIG. 1, the film deposition apparatus according to the present embodiment further includes a control unit 100 that controls the entirety of the film deposition apparatus and a storing unit 101. The control unit 100 may be a computer. The storing unit 101 stores a program by which the film deposition apparatus executes the film deposition method (as will be explained later) under a control of the control unit 100. The program is formed to include steps capable of executing the film deposition method. The storing unit 101 may be a hard disk or the like, for example. The program stored in the storing unit 101 may be previously stored in a recording medium 102 such as a compact disk (CD), a magneto-optic disk, a memory card, a flexible disk, or the like and may be installed in the storing unit 101 using a predetermined reading device.

The control unit 100 may also control a setting temperature of the heater unit 7, and the flow controller 122 that adjusts the flow rate of the halogen-containing gas supplied to the reaction gas nozzle 33. By doing this, while the temperature of the heater unit 7 can be set at a predetermined temperature that does not cause the etching effect of the halogen-containing gas, the halogen-containing gas can be supplied at a flow rate where the halogen-containing gas does not reach the bottom surface of the recessed pattern of the wafer W and stay and adsorb on the upper portion of the recessed pattern.

[Film Deposition Method]

Next, a film deposition method according to an embodiment of the present invention is described below by citing an example of using the above-mentioned film deposition apparatus, with reference to FIGS. 9A through 9E. FIGS. 9A through 9E are diagrams illustrating an example of a series of processes of the film deposition method according to the embodiment of the present invention.

Figure 9A:
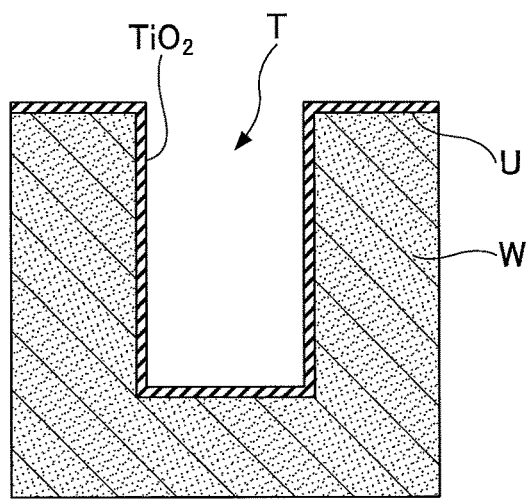
FIGS. 9A through 9E are diagrams illustrating a series of processes of a film deposition method according to an embodiment of the present invention.

In this embodiment, a silicon wafer is used as the wafer W and the silicon wafer has a trench T (concave portion) as illustrated in FIG. 9A. A small amount of thin film of $TiO_2$ is formed in the trench T and on a surface U of the wafer W. An example of supplying $TiCl_4$ from the reaction gas nozzle 31, $H_2O$ from the second reaction gas nozzle 32 as the oxidation gas, and $ClF_3$ from the reaction gas nozzle 33, respectively, is described below. With respect to the plasma generator 80, a case where the plasma generator 80 is not mounted, or not used even if mounted, is described as an example.

First, a gate valve (not illustrated in the drawings) is opened and the wafer W is transferred to the concave portion 24 of the turntable 2 via the transfer port 15 (FIG. 2 and FIG. 3) by the transfer arm 10 (FIG. 3) from the outside. This transfer is performed by lifting the lift pins (not illustrated in the drawings) via through holes provided in the bottom surface of the concave portion 24 from the bottom portion side of the vacuum chamber 1 when the concave portion 24 stops at a position facing the transfer port 15. By repeating such a wafer transfer while intermittently rotating the turntable 2, the wafers W are loaded into the concave portions 24, respectively.

Then, the gate valve is closed, and the vacuum chamber 1 is evacuated by the vacuum pump 640 to the attainable degree of vacuum. Then, $N_2$ gas as a separation gas is discharged from the separation gas nozzles 41 and 42 at a predetermined flow rate. At this time, $N_2$ gas is also discharged from the separation gas supplying pipe 51 and the purge gas supplying pipes 72 and 73 at a predetermined flow rate, respectively. With this, the vacuum chamber 1 is adjusted to a preset processing pressure by the pressure regulator 650 (FIG. 1). Then, the wafers W are heated to 120 degrees C., for example, by the heater unit 7 while rotating the turntable 2 in a clockwise direction at a rotational speed of 30 rpm, for example. The rotational speed of the turntable 2 can be set at a variety of rotational speeds depending on the intended purpose. As described above, the temperature of the wafers W needs to be set at a predetermined temperature that does not cause $ClF_3$ to exert an etching action or lower, and is preferably set at 250 degrees C. or lower. In the present embodiment, the temperature of the wafers W is set at 120 degrees C.

Subsequently, $TiCl_4$ gas is supplied from the reaction gas nozzle 31 (FIG. 2 and FIG. 3), and $H_2O$ gas is supplied from the reaction gas nozzle 32. Furthermore, $ClF_3$ gas is supplied from the reaction gas nozzle 33.

By the rotation of the turntable 2, the wafer W repeatedly passes through the third process area P3, the separation area D, the first process area P1, the separation area D, and the second process area P2 in this order (see FIG. 3). On this occasion, although each of the wafers W starts the process from different locations of the process areas P1 through P3 or separation areas D depending on the first placed location when the turntable 2 starts rotating, the case where each of the wafers W starts from the third process area P3 is described below for the purpose of illustration.

Figure 9B:
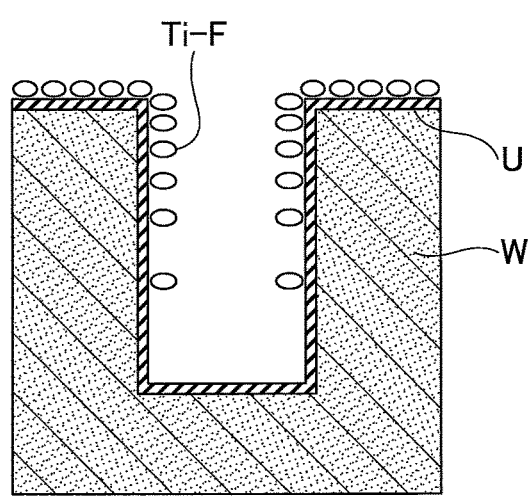

FIG. 9B is a diagram illustrating an example of a halogen-containing gas supply process. As illustrated in FIG. 9B, when the wafer W pass through the third process area P3, $ClF_3$ is supplied to a thin film layer L in a trench T, and adsorbs on the thin film layer L. On this occasion, the flow rate of $ClF_3$ is set to a predetermined flow rate that causes $ClF_3$ to go to and adsorb on the surface U of the wafer W and the upper portion of the trench T but not to adsorb on the bottom surface of the trench T, or lower the predetermined temperature. Thus, adsorption blocking groups Ti—F are formed on the surface U of the wafer W and the upper portion (near the opening) of the trench T but are not formed on and around the bottom surface in the trench T.

Figure 9C:
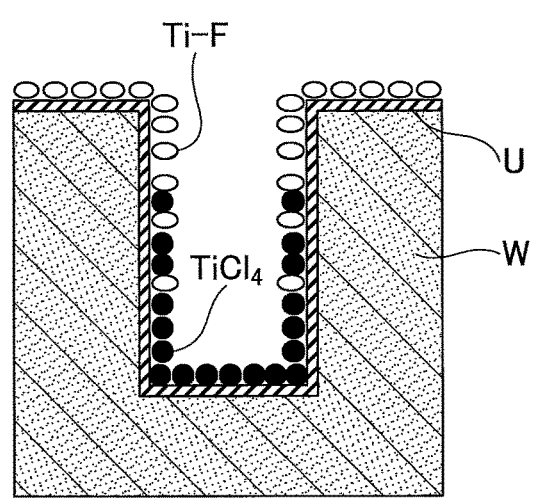

FIG. 9C is a diagram illustrating an example of a first reaction gas supply process. As illustrated in FIG. 9C, after the wafer W is purged by a supplied purge gas when passing through the separation area D, $TiCl_4$ gas is supplied to the wafer W when the wafer W passes through the first process area P1. $TiCl_4$ gas does not adsorb on an area where the adsorption blocking groups Ti—F are present very much, and adsorbs on an area where the adsorption blocking groups are not present a lot. Accordingly, $TiCl_4$ adsorbs on and near the bottom surface in the trench T.

Figure 9D:
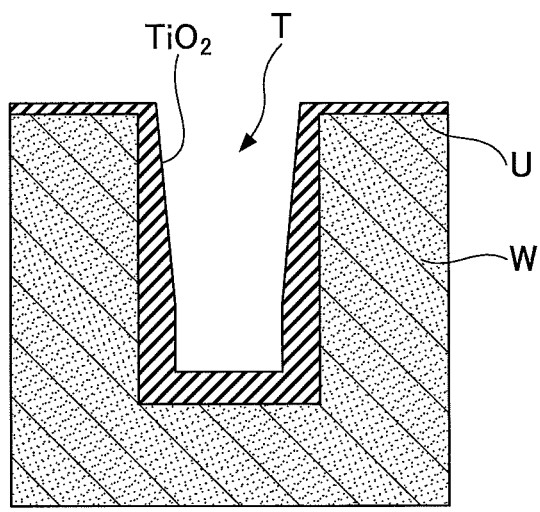

FIG. 9D is a diagram illustrating an example of a second reaction gas supply process. As illustrated in FIG. 9D, after the wafer W is purged by a supplied purge gas when passing through the separation area D, $H_2O$ gas that reacts with $TiCl_4$ and then produces a reaction product of $TiO_2$ is supplied to the wafer W when the wafer W passes through the second process area P2. By supplying $H_2O$ gas, $TiCl_4$ adsorbed on the surface in the trench T reacts with $H_2O$, thereby forming a molecular layer of the $TiO_2$ film as a reaction product. Here, because a considerable amount of $TiCl_4$ adsorbs on and near the bottom portion of the trench T, a considerable amount of $TiO_2$ film is formed on and near the bottom portion of the trench T. Hence, the bottom-up filling film deposition as illustrated in FIG. 9D can be achieved.

Next, when the wafer W passes through the third process area P3, the trench T and the surface U of the wafer W goes into the state of FIG. 9B again, and the adsorption blocking groups Ti—F adsorb on the upper portion in the trench T and the surface U of the wafer W.

Hereinafter, by rotating the turntable 2 repeatedly while supplying each reaction gas, a cycle illustrated from FIGS. 9B to 9D is repeated, thereby depositing the $TiO_2$ film from the bottom side while not blocking the opening of the trench T.

Figure 9E:
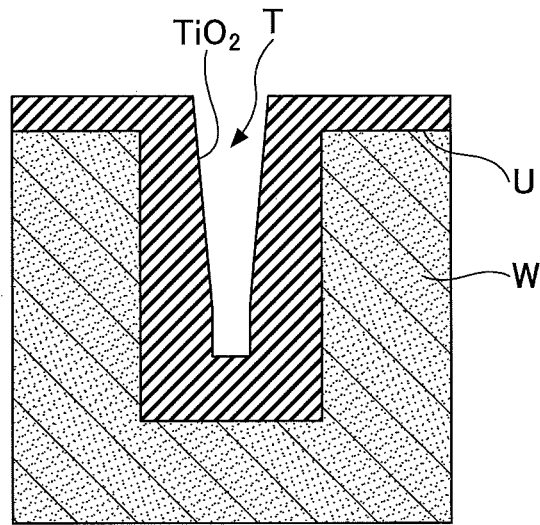

FIG. 9E is a diagram illustrating a stage in which the film deposition further progresses. As illustrated in FIG. 9E, bottom-up filling film deposition that does not block the opening can be achieved while forming a V-letter cross section in the $TiO_2$ film. Then, the trench T can be filled up with a seamless film in the end, and the high-quality filling film deposition can be achieved without generating a void and the like.

Thus, the film deposition method according to the embodiment of the present invention can achieve selective film deposition with high bottom-up properties by performing film deposition of ALD (Atomic Deposition Layer) while forming the adsorption blocking groups by supplying the halogen-containing gas to the upper portion of the trench T.

The present embodiments have been described by citing an example of using $ClF_3$ as the halogen-containing gas, but as described above, it goes without saying that $F_2$, $NF_3$, $CF_4$, $BCl_3$, HCl and the like can be used as the halogen-containing gas. Moreover, in addition to $H_2O$, $H_2O_2$ and the like, or another oxidation gas may be used as the second reaction gas. Furthermore, when a nitriding film is deposited, a nitriding gas such as $NH_3$ may be used. Also, other than $TiCl_4$, a variety of source gases can be used as the first reaction gas.

The present embodiments have been described by citing an example of not using the plasma generator 80, plasma can be naturally used in a range where the halogen-containing gas does not have the etching effect. In this case, the embodiments can be applied to a process in which the temperature of the wafer W is slightly set higher.

[Modified Embodiment]

The embodiments in which the halogen-containing gas is supplied to the wafer W to generate the adsorption blocking groups have been described hereinabove. However, a similar effect can be acquired by converting a mixed gas of $Ar/H_2$ to plasma. In other words, an H group serves as the adsorption blocking group, and can block the adsorption of the source gas such as $TiCl_4$, which makes it possible to perform the bottom-up film deposition. To perform such a film deposition method, while the plasma generator 80 is mounted and started, the mixed gas of $Ar/H_2$ only has to be supplied to the wafer W while being converted to plasma, and the H groups are adsorbed on the upper portion of the trench T as the adsorption blocking groups, thereby performing the film deposition by ALD.

[Experimental Results]

Next, experimental results showing effectiveness of the embodiments of the present invention are described below.

Figure 10:
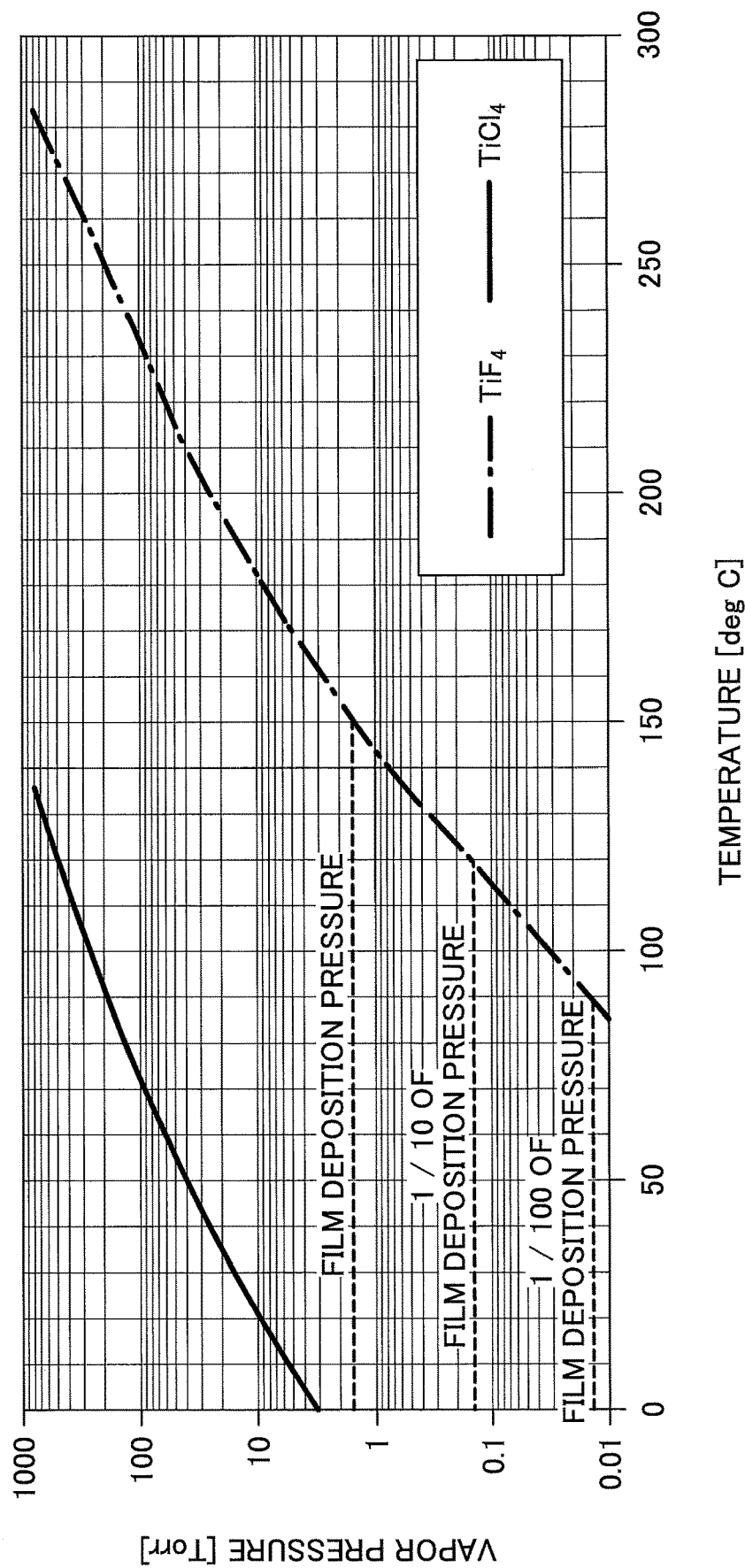
FIG. 10 is an experimental result for showing residual characteristics on a surface of a Ti—F group.

FIG. 10 shows an experimental result for showing surface residual characteristics of a Ti—F group. In the present experiment, when the Ti—F group that was an adsorption blocking group was generated in a trench T of a wafer W, whether $TiF_4$ can serve as the adsorption blocking group without evaporating was confirmed.

As shown in FIG. 10, a vapor pressure of $TiF_4$ is lower than that of $TiCl_4$, and an evaporating temperature was high even at a film deposition pressure and pressures of tenth part and hundredth part of the film deposition pressure. Hence, when a fluorine-containing gas is supplied to the wafer, the adsorption blocking groups Ti—F do not evaporate and remain on the surface of the wafer W, thereby appropriately serving as the adsorption blocking group.

Figure 11:
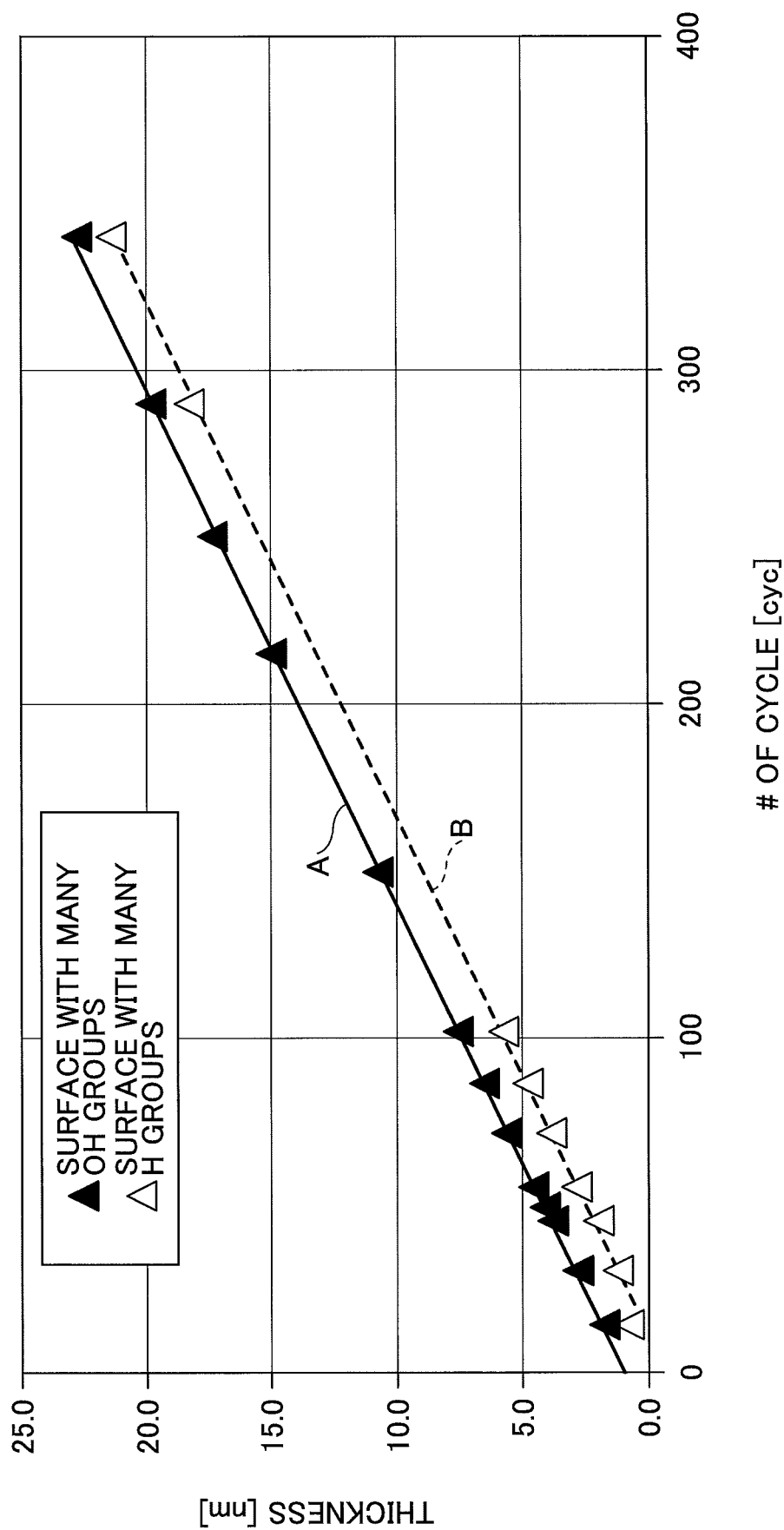
FIG. 11 is an experimental result of film deposition time examined in an experiment where an H group that is an adsorption blocking group is formed on a surface of a wafer and then a film is deposited thereon.

FIG. 11 shows an experimental result of examining film deposition starting time when an H group that was an adsorption blocking group was formed on a surface of a wafer and then film deposition was performed. FIG. 11 indicates that the film deposition starting time of a characteristic line B in which H groups were formed on a surface lagged behind the film deposition starting time of a characteristic line A in which OH groups were formed on the surface in the vicinity of the original point (near a cycle zero). Thus, by forming the adsorption blocking groups on the surface of the wafer W, the film deposition can be blocked. By forming the adsorption blocking groups on the upper portion of the trench T while utilizing the characteristics as illustrated in the embodiments of the present invention, the film deposition at the upper portion of the trench T can be blocked, thereby performing the film deposition with the high bottom-up properties.

As discussed above, according to the embodiments, film deposition with high bottom-up properties can be performed.

All examples recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that various changes, substitutions, and alterations could be made hereto without departing from the spirit and scope of the invention.

What is claimed is:

1. A film deposition method for filling a recessed pattern formed in a surface of a substrate with a film from a bottom surface of the recessed pattern, the method comprising steps of:
   supplying $ClF_3$ gas to a top surface of a substrate and an upper portion of a recessed pattern formed in the top surface of the substrate, thereby forming an adsorption blocking group containing fluorine on the top surface of the substrate and the upper portion of the recessed pattern;
   supplying a first reaction gas to a surface of the substrate including the top surface and the recessed pattern to cause the first reaction gas to adsorb on an area where the adsorption blocking group containing fluorine is not formed on, the area including a bottom portion of the recessed pattern other than the top surface of the substrate and the upper portion of the recessed pattern; and
   supplying a second reaction gas reactable with the first reaction gas to the surface of the substrate to produce a reaction product of the first reaction gas adsorbed on the bottom portion of the recessed pattern and the second reaction gas, thereby depositing a molecular layer of the reaction product on the bottom portion of the recessed pattern.

2. The film deposition method according to claim 1, wherein a temperature of the substrate is set at a predetermined temperature or lower that does not cause an etching action of the $ClF_3$ gas.

3. The film deposition method according to claim 2, wherein the predetermined temperature is 250 degrees C.

4. The film deposition method according to claim 2, wherein in the predetermined temperature is 150 degrees C.

5. The film deposition method according to claim 1, wherein the first reaction gas is a titanium-containing gas.

6. The film deposition method according to claim 5, wherein the titanium-containing gas is $TiCl_4$, and the reaction product is $TiO_2$.

7. The film deposition method according to claim 1,
   wherein the substrate is arranged on a turntable along a circumferential direction thereof,
   wherein a $ClF_3$ gas supply area, a first reaction gas supply area, and a second reaction gas supply area are arranged above the turntable, along the circumferential direction, and apart from each other, and
   wherein the steps of supplying the $ClF_3$ gas, supplying the first reaction gas, and supplying the second reaction gas are sequentially repeated by rotating the turntable in a rotational direction, thereby depositing the molecular layer on the bottom portion of the recessed pattern.

8. The film deposition method according to claim 7,
   wherein purge gas supply areas are arranged between the halogen gas supply area and the first reaction gas supply area, and between the first reaction gas supply area and the second reaction gas supply area, and
   further comprising:
   supplying a purge gas to the surface of the substrate between the steps of supplying the $ClF_3$ gas and supplying the first reaction gas, and between the steps of supplying the first reaction gas and supplying the second reaction gas, respectively.

9. The film deposition method according to claim 1, wherein the $ClF_3$ gas is supplied to the surface of the substrate while being activated by plasma.

* * * * *